US 7,915,081 B2

(12) United States Patent
Tomita et al.

(10) Patent No.: US 7,915,081 B2
(45) Date of Patent: Mar. 29, 2011

(54) FLEXIBLE INTERCONNECT PATTERN ON SEMICONDUCTOR PACKAGE

(75) Inventors: Yoshihiro Tomita, Ibaraki-Ken (JP); David Chau, Chandler, AZ (US); Gregory M. Chrysler, Chandler, AZ (US); Devendra Natekar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 382 days.

(21) Appl. No.: 11/395,549

(22) Filed: Mar. 31, 2006

(65) Prior Publication Data

US 2007/0231953 A1 Oct. 4, 2007

(51) Int. Cl.
H01L 21/00 (2006.01)
H01L 21/44 (2006.01)
(52) U.S. Cl. .................. 438/109; 438/611; 257/E21.499
(58) Field of Classification Search .................. 438/109, 438/611
See application file for complete search history.

(56) References Cited

U.S. PATENT DOCUMENTS

| | | | | |
|---|---|---|---|---|
| 5,768,750 A * | 6/1998 | Williams | ................. | 19/80 R |
| 5,994,222 A * | 11/1999 | Smith et al. | ................. | 438/689 |
| 6,319,755 B1 * | 11/2001 | Mauri | ................. | 438/119 |
| 6,479,893 B2 * | 11/2002 | Embong et al. | ................. | 257/690 |
| 6,515,370 B2 * | 2/2003 | Hashimoto | ................. | 257/777 |
| 6,589,859 B2 * | 7/2003 | Petitbon et al. | ................. | 438/611 |
| 6,790,706 B2 * | 9/2004 | Jeung et al. | ................. | 438/113 |
| 7,443,019 B2 * | 10/2008 | Bauer et al. | ................. | 257/692 |
| 2004/0227238 A1* | 11/2004 | Hashimoto | ................. | 257/738 |

* cited by examiner

*Primary Examiner* — David A Zarneke
(74) *Attorney, Agent, or Firm* — Blakely, Sokoloff, Taylor & Zafman LLP

(57) ABSTRACT

An embodiment of the present invention is a technique to fabricate a metal interconnect. A first metal trace is printed on a die attached to a substrate or a cavity of a heat spreader in a package to electrically connect the first metal trace to a power contact in the substrate. A device is mounted on the first metal trace. The device receives power from the substrate when the package is powered.

11 Claims, 8 Drawing Sheets

FLEXIBLE INTERCONNECT PATTERN ON SEMICONDUCTOR PACKAGE

BACKGROUND

1. Field of the Invention

Embodiments of the invention relate to the field of semiconductor, and more specifically, to semiconductor fabrication.

2. Description of Related Art

Metal interconnects are used to connect various elements in a semiconductor die. The interconnects provide electrically conducting paths to carry currents or provide power for various devices or circuits. Within an integrated circuit die, metal layers are stacked on top of one another by using dielectrics that insulate the metal layers from each other. Typically, each metal layer may form electrical contact to an additional metal layer through holes or vias filled with a metal. When interconnects are used to connect components external to a die such as sensors or thermoelectric coolers (TECs), the fabrication of the metal interconnects to provide power to these components may require complex patterning or etching processes and may require large real estate on the die.

Redistribution layer (RDL) is a technique to reduce the space required for interconnecting patterns. In an RDL, an additional level of wiring repositions the bond pads of the semiconductor die. This technique typically used sputtering or plating which requires the photo sensitive mask process to pattern the metal layers or the interconnects structure. This technique may be complex, expensive, and inflexible.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to fabricate a metal interconnect. A first metal trace is printed on a die attached to a substrate or a cavity of a heat spreader in a package to electrically connect the first metal trace to a power contact in the substrate. A device is mounted on the first metal trace. The device receives power from the substrate when the package is powered.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to provide a flexible interconnect pattern on semiconductor packages. The flexible interconnect pattern may be used to provide power to an external device or devices, such as a sensor or a TEC. The technique applies a flexible metal routing structure for the interconnect using a mask-less process such as the ink-jet printing. The interconnect pattern is on the backside of the die or on the underneath cavity side of the heat spreader to bring power to the device or the TEC. The TEC may be placed near hotspots of the die to cool the die efficiently. The technique provides a cost effective fabrication of metal interconnects to device external to the die. It is mask-less and flexible. The ink-jet printing is fast and provides flexibility in changing structure design and location.

Figure 1A:
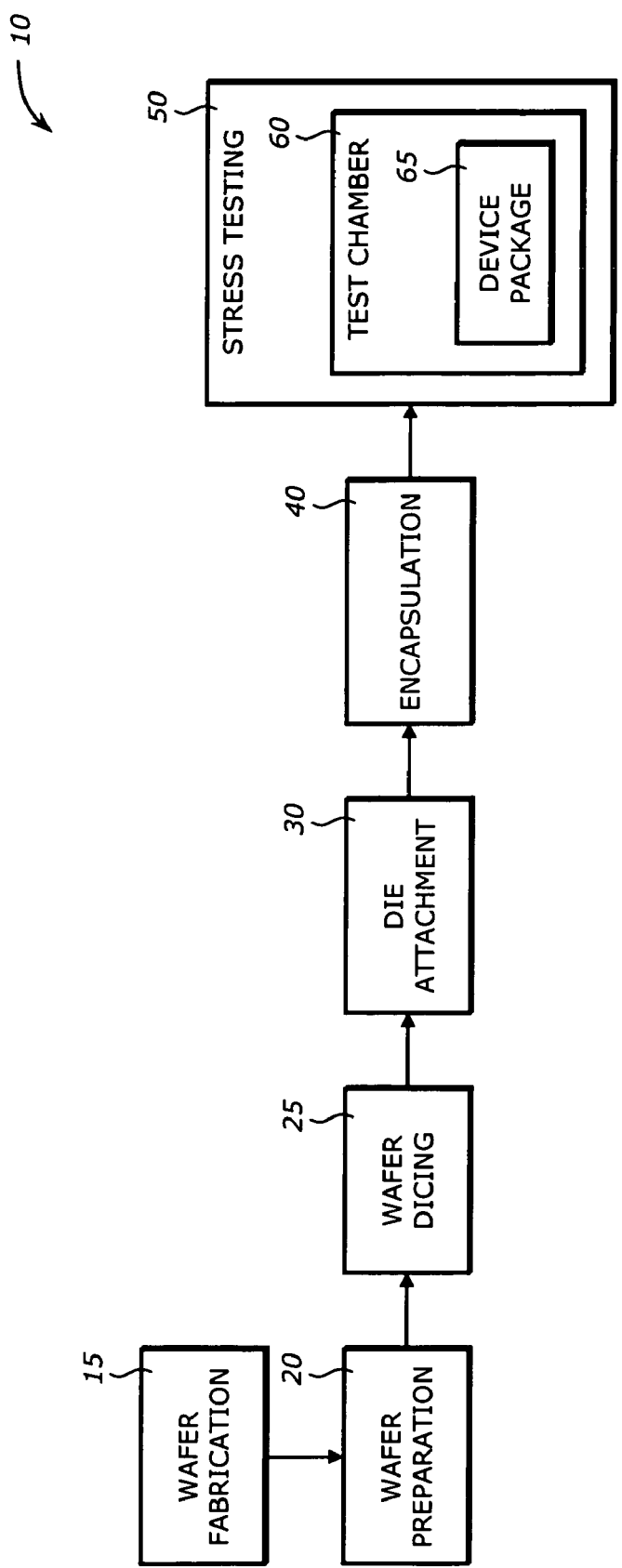
FIG. 1A is a diagram illustrating a manufacturing system in which one embodiment of the invention can be practiced.

FIG. 1A is a diagram illustrating a manufacturing system 10 in which one embodiment of the invention can be practiced. The system 10 includes a wafer fabrication phase 15, wafer preparation phase 20, a wafer dicing phase 25, a die attachment phase 30, an encapsulation phase 40, and a stress testing phase 50. The system 10 represents a manufacturing flow of a semiconductor packaging process.

The wafer fabrication phase 15 fabricates the wafer containing a number of dice. The individual dice may be any microelectronic devices such as microprocessors, memory devices, interface circuits, etc. Each die may have an external device or multiple devices mounted on the back side. The external device may be a sensor or a TEC, or any device that may need power from the substrate. The wafer fabrication phase 15 includes typical processes for semiconductor fabrication such as preparation of the wafer surface, growth of silicon dioxide ($SiO_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or more recently copper. The various metal layers are interconnected by etching holes, called "vias," in the insulating material. During this phase, the TEC may be strategically mounted on each die together with the fabrication process for the circuit of the device.

The wafer preparation phase 20 prepares a wafer containing dice for packaging and testing. During this phase, the wafers are sorted after the patterning process. An inspection may be carried out to check for wafer defects. Then, the wafer may be mounted on a backing tape that adheres to the back of the wafer. The mounting tape provides mechanical support for handling during subsequent phases.

The wafer dicing phase 25 dices, cuts, or saws the wafer into individual dice. High precision saw blade and image recognition unit may be used. De-ionized water may be dispensed on the wafer to wash away any residual particles or contaminants during the dicing. Then, the wafer is dried by being spun at high spinning speed.

The die attachment phase 30 attaches the die to a package substrate. The substrate material depends on the packaging type. It may be lead-frame, plastic, or epoxy.

The encapsulation phase 40 encapsulates the die and the substrate. Depending on the packaging type, this may include molding, wire bonding, and solder ball attachment. Underfill material may be dispensed between the die and the substrate. Integrated heat spreader (IHS) may be attached to the die and substrate assembly. The encapsulated assembly of the die and substrate becomes a device package 65 ready to be tested. During this phase, the device (e.g., sensor, TEC) may also be mounted on the cavity side of the IHS.

The stress testing phase 50 performs one or more tests such as Highly Accelerated Stress Test (HAST) or biased-HAST on the device package under stress conditions. A test chamber 60 may be designed to conduct a stress test. It may have monitoring circuits, measurement circuits, and other data processing equipment. The package 65 is placed in the test chamber 60 subject to the stress test. It may be powered or non-powered. Various stress tests may be performed on the wafer or on the packaged devices 65 at various points of the manufacturing process flow. The tests may follow standards such as Joint Electron Device Engineering Council (JEDEC) standards or military standards. Examples of these tests may include electrostatic discharge (ESD), or human body model (HBM), high temperature operational life (HTOL), thermal shock, temperature cycle, high temperature storage, vibration and mechanical loading, shear testing, and accelerated moisture resistance.

Figure 1B:
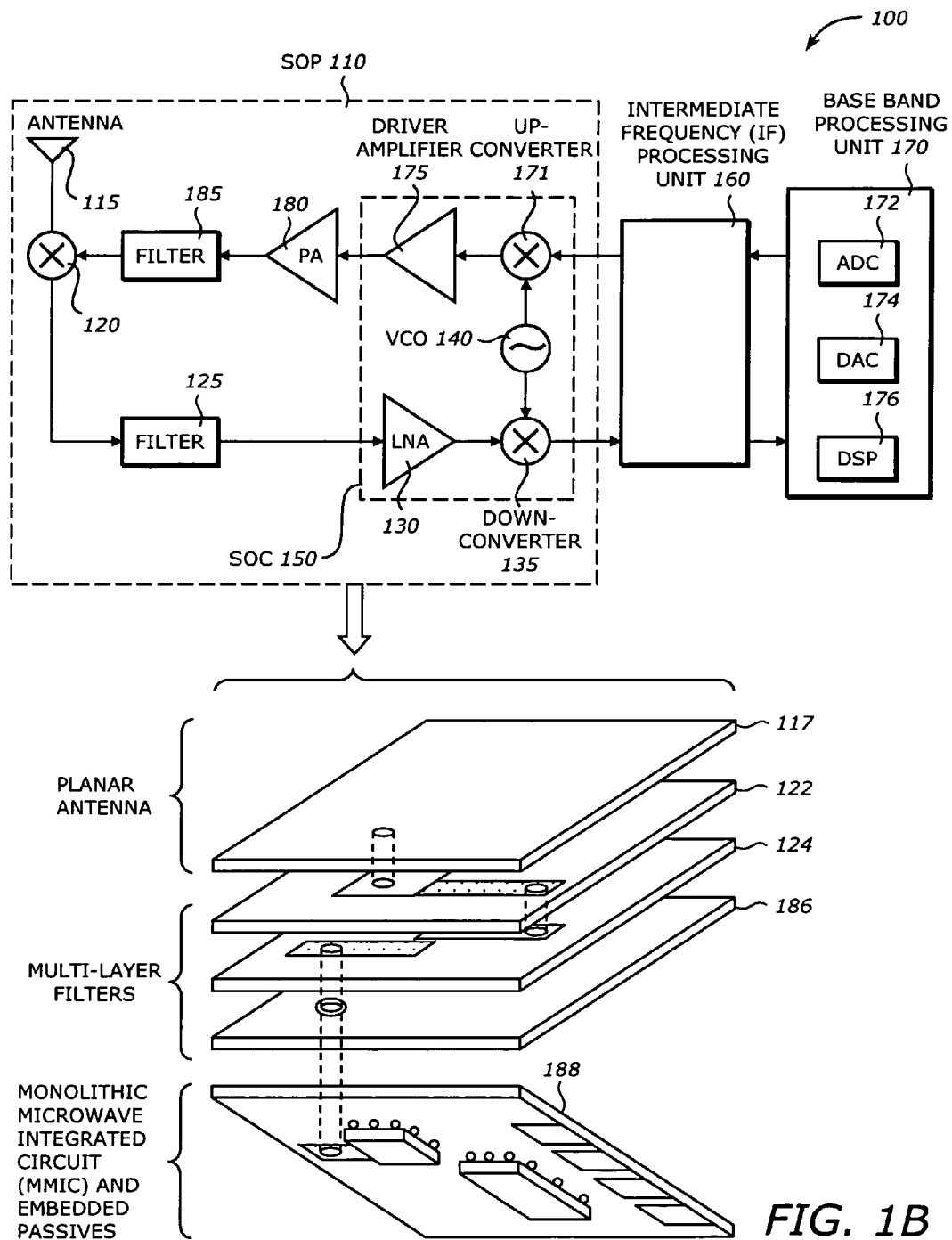
FIG. 1B is a diagram illustrating a system according to one embodiment of the invention.

FIG. 1B is a diagram illustrating a system 100 according to one embodiment of the invention. The system 100 represents a mobile communication module. It includes a system on package (SOP) 110, an intermediate frequency processing unit 160, and a base-band processing unit 170.

The SOP 110 represents the front end processing unit for the mobile communication module. It is a transceiver incorporating on-package integrated lumped passive components as well as radio frequency (RF) components. It includes an antenna 115, a duplexer 120, a filter 125, a system-on-chip (SOC) 150, a power amplifier (PA) 180, and a filter 18.

The antenna 115 receives and transmits RF signals. The RF signals are converted to digital data for processing in subsequent stages. The antenna 115 is designed in compact microstrip and strip-line for L and C-band wireless applications. The duplexer 120 acts as a switch to couple to the antenna 115 to the receiver and the transmitter to the antenna 115. The filters 125 and 185 are C-band LTCC-strip-line filter or multilayer organic lumped-element filter at 5.2 GHz and narrow-band performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 171, and a driver amplifier 175. The LNA 130 amplifies the received signal. The down converter 135 is a mixer to convert the RF signal to the IF band to be processed by the IF processing unit 160. The up converter 171 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The filter may provide base-band signal to the base-band processing unit 170. The base-band processing unit 170 may include an analog-to-digital converter (ADC) 172, a digital-to-analog converter (DAC) 174, and a digital signal processor (DSP) 176. The ADC 172 and the DAC 174 are used to convert analog signals to digital data and digital data to analog signal, respectively. The DSP 176 is a programmable processor that may execute a program to process the digital data. The DSP 176 may be packaged using Flip-Chip Ball Grid Array (FCBGA) packaging technology or any other suitable packaging technologies. The DSP 176 may be manufactured according to the manufacturing flow 10 shown in FIG. 1A. It may be the device package 65. The base-band processing unit 170 may also include memory and peripheral components.

The SOP 110 may be a multi-layer three-dimensional (3D) architecture for a monolithic microwave integrated circuit (MMIC) with embedded passives (EP) technology. It may be implemented using Low Temperature Co-fired Ceramics (LTCC) and organic-based technologies. The 3D architecture may include multiple layers include a layer 117 to implement the antenna 115, layers 122, 124, and 186 for the filters 125 and 185, and layer 188 for the SOC 150 and the passive components using EP technology. Typically, the packaging technology involves embedded passives with multiple layers.

Figure 2:
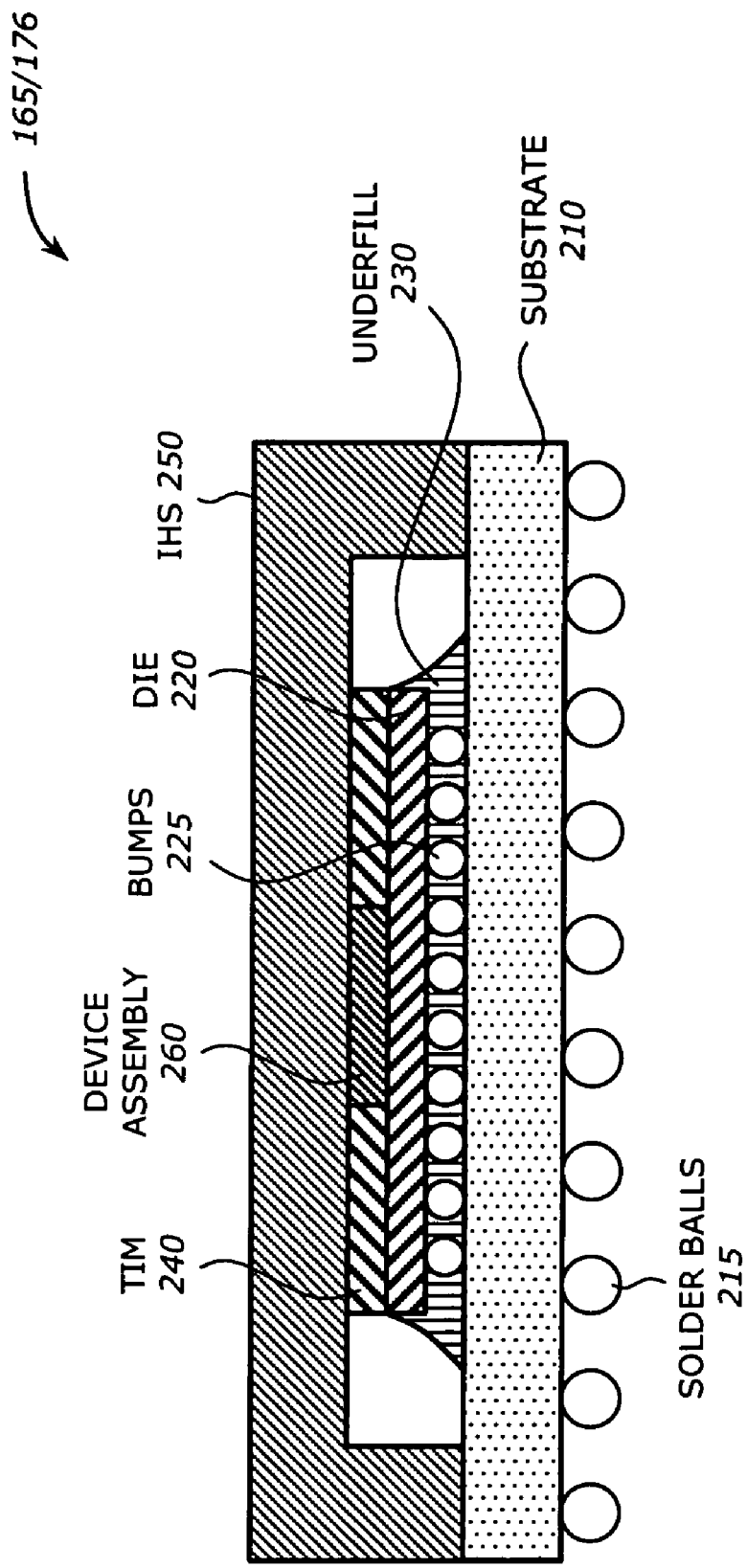
FIG. 2 is a diagram illustrating a package device according to one embodiment of the invention.

FIG. 2 is a diagram illustrating the package device 65 or 176 shown in FIG. 1A and FIG. 1B, respectively, according to one embodiment of the invention. The package device 65/176 includes a substrate 210, a die 220, an underfill 230, an integral heat spreader (IHS) 250, and a device assembly 260.

The substrate 210 is a package substrate that provides support for the die 220. The substrate 210 may be polymer or a composite. The substrate 210 may be selected for any suitable packaging technologies including Ball Grid Array (BGA), Pin Grid Array (PGA), or Land Grid Array (LGA). The substrate 210 may be attached to a number of solder balls 215. The solder balls 215 allow attachment of the package device 165 to a circuit board or to any other mounting component. The die 220 is any semiconductor die. It may have a microelectronic device such as a microprocessor, a memory, an interface chip, an integrated circuit, etc. The die 220 is attached to the substrate 110 by a number of solder bumps 225. The bumps 225 provide contact with the contact pads on the substrate. The bumps 225 may be fabricated using any standard manufacturing or fabrication techniques such as the controlled collapse chip connect (C4) technique. The underfill 230 is dispensed between die 220 and the substrate 210 to strengthen the attachment of die 220 to the substrate 210 to help prevent the thermal stresses from breaking the connections between die 220 and the substrate 210. The stresses may be caused by the difference between the coefficients of thermal expansion of die 220 and the substrate 210. The underfill 230 may contain filler particles suspended in an organic resin. The size of the filler particles are typically selected according to a gap between the die 220 and the substrate 210, e.g., the filler particles have a diameter about one third the size of the gap. Generally, the composition and concentration of filler particles are selected to control the coefficient of thermal expansion and the shrinkage of the underfill 230.

The IHS 250 may house or cover the die 220 on the substrate 210. It may include a flat surface and supporting walls on both or four sides of the die 220. During operation, the die 220 may generate heat. The heat may be transferred to the IHS 250 through a thermal interface material (TIM) 240. The TIM 240 may be located, or interposed, between the bottom surface of the IHS 250 and the top surface of the die 220. It may be attached to a heat generating device, such as the die 220, to transfer the heat to a heat spreader or a heat sink or any another heat dissipating device. The TIM 240 may be made of thermal grease, phase change material (PCM), pads, films, and gels, or any thermally conducting material such as Sn solder, or tungsten, or a combination of such materials, which also show good adhesion (e.g., wetting) with the IHS 250 and the die 220.

The device assembly 260 includes a device and metal interconnects. The device may be a sensor, a TEC, or any device that may receive power from the substrate when the package is powered. The TEC may be a solid state heat pump that operates on the Peltier effect. The TEC may include an array of p- and n-type semiconductor elements that act as two dissimilar conductors. The array of elements is connected between two metal interconnects, and may be connected in series and/or in parallel. As a direct current (DC) current passes through one or more pairs of elements from n- to p-, there is a decrease in temperature at the junction, resulting in the absorption of heat from the environment, e.g., from the die 220. The heat is carried through the TEC by electron transport and released on the opposite side as the electrons move from a high to low energy state. The TEC is placed between the die 220 and the IHS 250. It receives power from the power contacts in the substrate 210. The metal interconnects form a flexible interconnect pattern that may be routed on the die 220 or the cavity of the IHS 250.

Figure 3A:
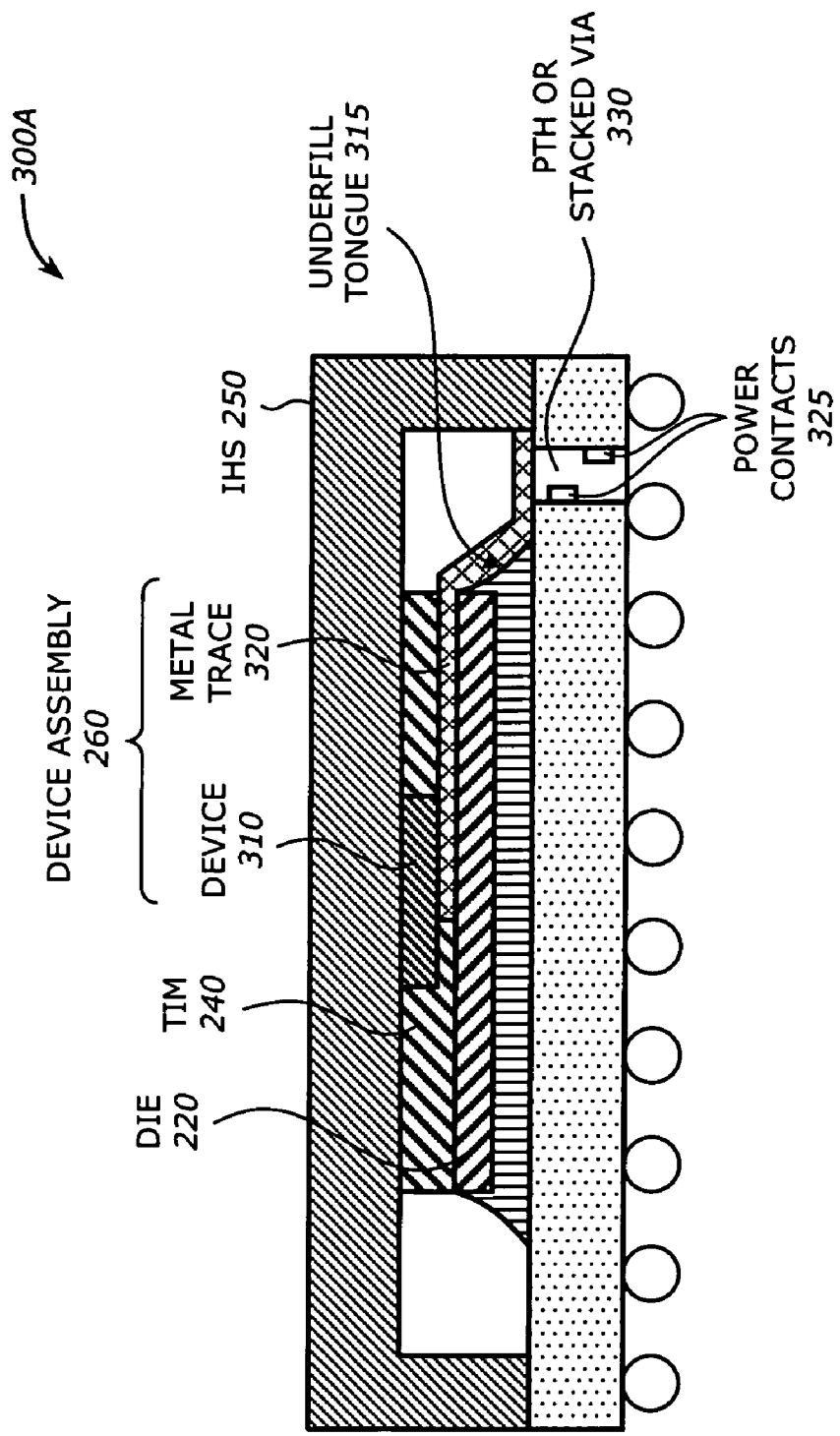
FIG. 3A is a diagram illustrating a routing pattern of a device assembly on a die according to one embodiment of the invention.

FIG. 3A is a diagram illustrating a routing pattern 300A of the device assembly 260 on the die 220 shown in FIG. 2 according to one embodiment of the invention. The device assembly 260 includes a device 310 and a metal trace 320. More than one metal trace may be used.

The metal trace 320 is printed on the die 220 and is electrically connected to a power contact 325 in the substrate 210. The metal trace 320 may use a metal which may be one of copper, silver, aluminum, gold, solder, and metal alloy. It carries current from the power contact 325 to provide power to the device 310. The power contact 325 may be a power or a ground contact. Typically both ground and power contacts are used to provide proper voltage supply to the device 310. There may be two metal traces like the metal trace 320 to connect to both power and ground contacts from the substrate 210.

The device 310 is attached or mounted on the metal trace 320. It may be soldered to one end of the metal trace 320. The device 310 receives power from the substrate 210 when the package is powered. When the device is a TEC, it cools the die 220 by heat transfer when the package is powered. The device 310 is typically placed directly on or at a close distance to the die 220 at a strategic location. When the device is a TEC, the strategic location or region on which the device 310 is mounted is responsive to heat generated by the die 220. Multiple TECs may be mounted at different locations. Typically, these locations correspond to the hotspots on the back side of the die 220. The TIM 240 may be deposited between the device 310, the die 220, and the IHS 250 to improve thermal transfer and mechanical stability.

The metal trace 320 is routed from backside of the die 220, over an underfill tongue 315 and to surface of the substrate 210. It then makes electrical contact with the power contact 325 at the plated through hole (PTH) or stacked via 330 through a metal pad. The underfill tongue 315 is on the slope surface of the underfill on a side of the die 220. The metal trace 320 may be printed on the die 220 using a printing technique such as the ink-jet printing. Ink-jet printing technologies allow fabrication of metal interconnects of flexible size, shape, and pattern, and small resolution. The metal trace 320 may have a very small resolution in the order of a few µms. There may be another metal trace printed in the same manner with the metal trace 320 to form a multi-layered structure with the metal trace 320.

Figure 3B:
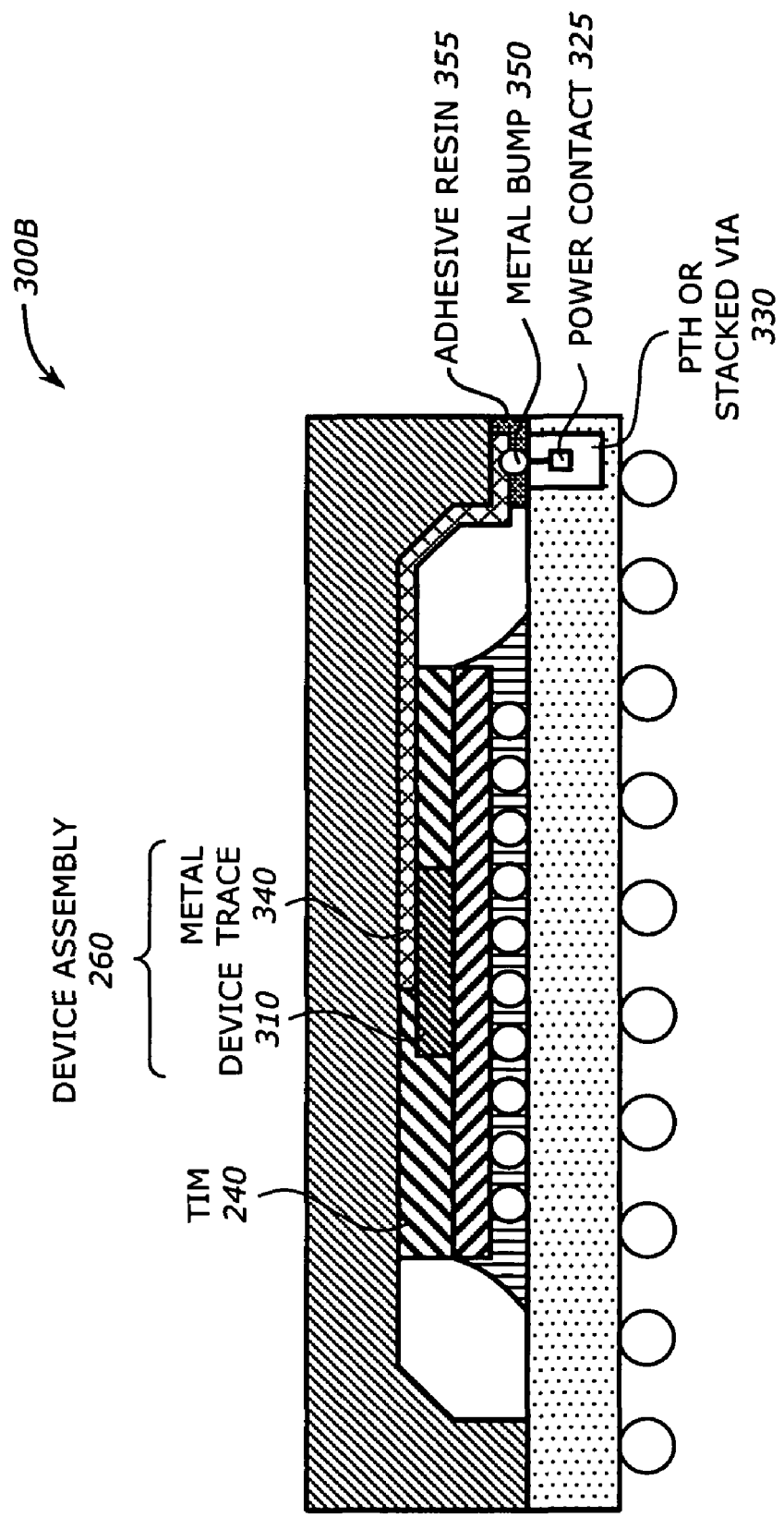
FIG. 3B is a diagram illustrating a routing pattern of a device assembly on a heat spreader according to one embodiment of the invention.

FIG. 3B is a diagram illustrating a routing pattern 300B of the device assembly 260 on the heat spreader 250 shown in FIG. 2 according to one embodiment of the invention. The device assembly 260 includes the device 310 and a metal trace 340. The device 310 is as described above.

The metal trace 340 is printed on the cavity of the heat spreader 250 in the package 65/176 (FIG. 2). It is printed in a similar manner as in FIG. 3A except that it is printed on the cavity side of the heat spreader 250 instead of on the die 220. The metal trace 340 is electrically connected to the power contact 325 in the substrate 210.

The device 310 is attached or mounted on the metal trace 340 in the same manner as in FIG. 3A. It may be placed at a small distance from the die 220. The TIM 240 may be deposited between the device 310, the die 220, and the IHS 250 to improve thermal transfer and mechanical stability. The device 310 receives power from the substrate 210 when the package is powered.

The metal trace 340 is routed on the cavity of the heat spreader 250 to a metal bump 350 on the substrate 210. The metal bump is connected to the power contact 325 at the PTH or stacked via 330. Due to the thickness of the metal bump 350 and the metal trace 340, there may be a small gap between the heat spreader 250 and the surface of the substrate 210. An adhesive resin 355 may be dispensed to fill up this gap between the heat spreader 250 and the substrate 210 at the end portion of the metal trace 340 around the metal bump 350.

Figure 3C:
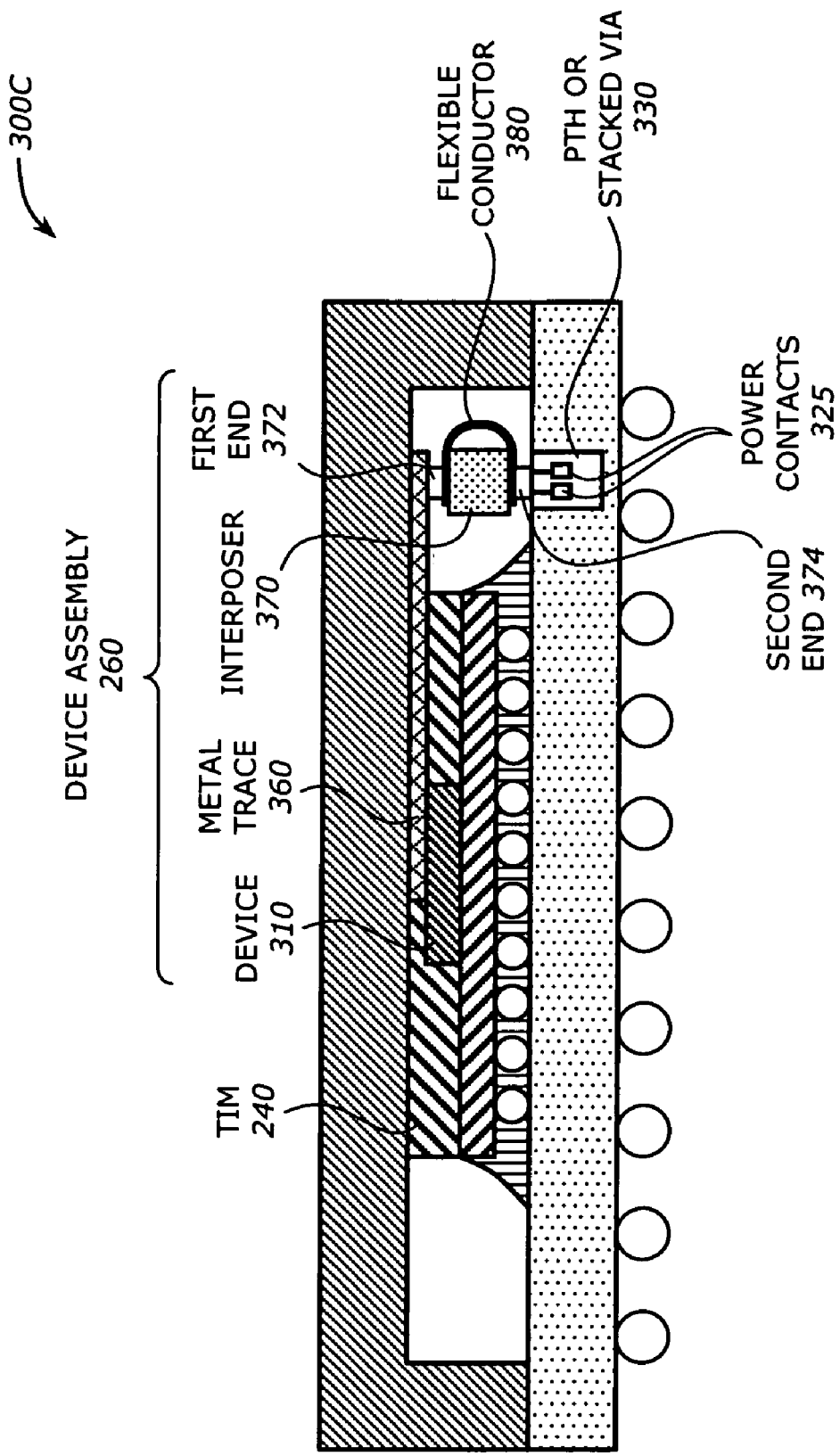
FIG. 3C is a diagram illustrating a routing pattern of the device assembly on a heat spreader with an interposer according to one embodiment of the invention.

FIG. 3C is a diagram illustrating a routing pattern 300C of the device assembly 260 on the heat spreader 250 with an interposer according to one embodiment of the invention. The device assembly includes the device 310, a metal trace 360, and an interposer 370. The device 310 is described above.

The metal trace 360 is printed on the cavity of the heat spreader 250 in the same manner as in FIG. 3B. The metal trace 360 does not make direct mechanical contact with the power contact 325 in the substrate 210 but it is electrically connected to the power contact 325 through the interposer 370.

The device 310 is attached or mounted on the metal trace 360 in the same manner as in FIG. 3B. It may be placed at a small distance from the die 220. The TIM 240 may be deposited between the device 310, the die 220, and the IHS 250 to improve thermal transfer and mechanical stability. The device 310 receives power from the substrate 210 when the package is powered.

The interposer 370 is a small or mini interposer. It is placed between the heat spreader 250 and the substrate 210. It has a height sufficiently small to fit within the distance between the underneath surface of the heat spreader 250 and the surface of the substrate 210. It has a first end 372 and a second end 374 and a flexible conductor 380 connecting the first end 372 and the second end 374. The second end 374 is connected or soldered to the power contact 325 at the PTH or stacked via 330.

The metal trace 360 is routed on the cavity of the heat spreader 250 to the first end 372 of the interposer 370. It may be soldered directly on the first end 372. Through the flexible conductor 380, the metal trace 360 is electrically connected to the power contact 325 in the substrate 210. The total height of the interposer 370, the metal trace 360, and the flexible conductor 380 may be fit to the distance between the underneath surface of the heat spreader 250 and the surface of the substrate 210.

Figure 4:
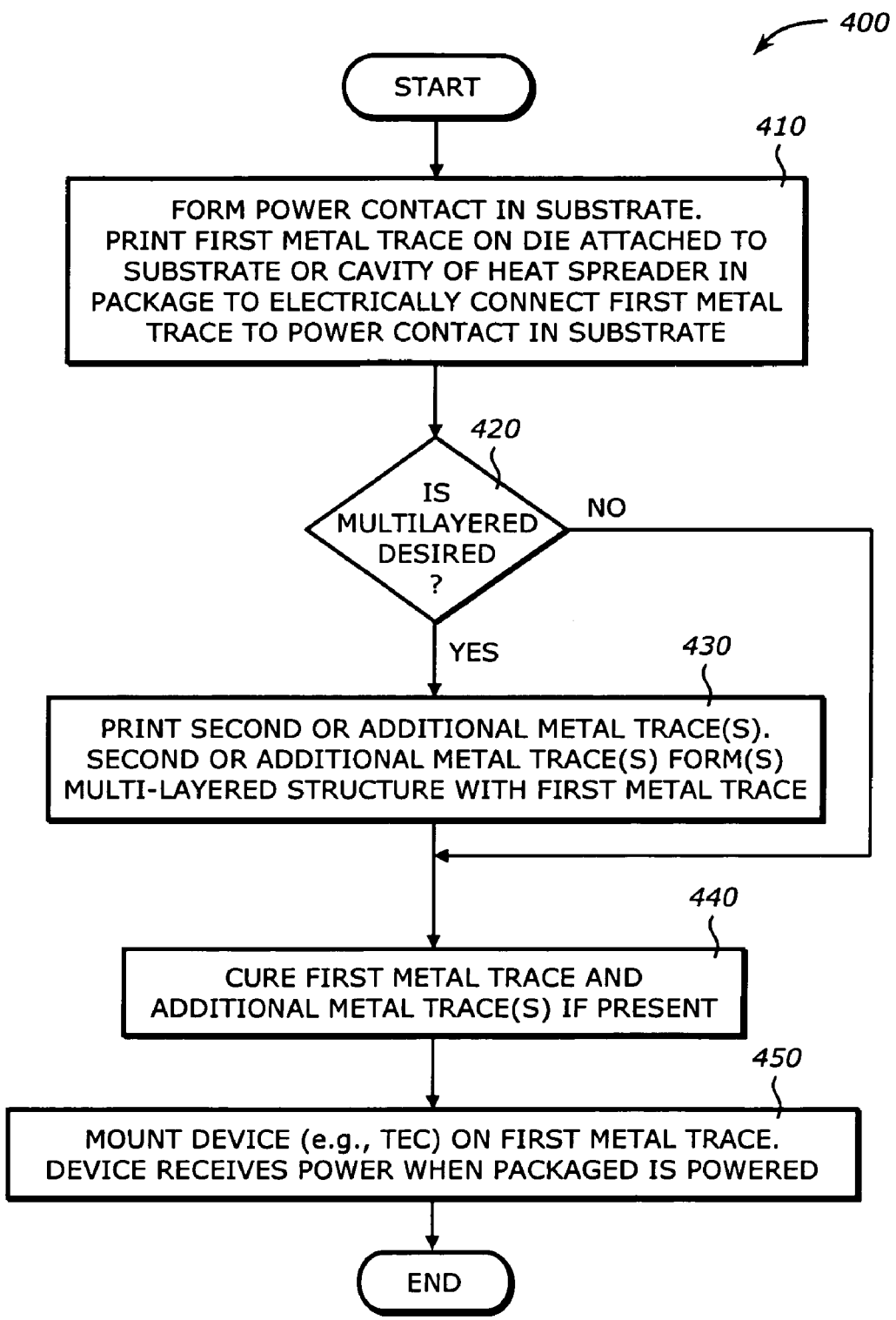
FIG. 4 is a flowchart illustrating a process to fabricate a device assembly according to one embodiment of the invention.

FIG. 4 is a flowchart illustrating a process 400 to fabricate a device assembly according to one embodiment of the invention.

Upon START, the process 400 forms a power contact in a substrate and prints a first metal trace on a die attached to a substrate or a cavity of a heat spreader in a package to electrically connect the first metal trace to the power contact in the substrate (Block 410). Next, the process 400 determines if a multi-layered structure is desired (Block 420). If not, the process 400 proceeds to Block 440. Otherwise, the process 400 prints a second metal trace or additional metal trace(s) to form a multi-layered structure with the first metal trace (Block 430). Then, the process 400 cures the first metal trace or additional metal trace(s) if present (Block 440).

Next, the process 400 attaches or mounts a device on the first metal trace (Block 450). The device receives power from the substrate when the package is powered. The process 400 is then terminated.

Figure 5:
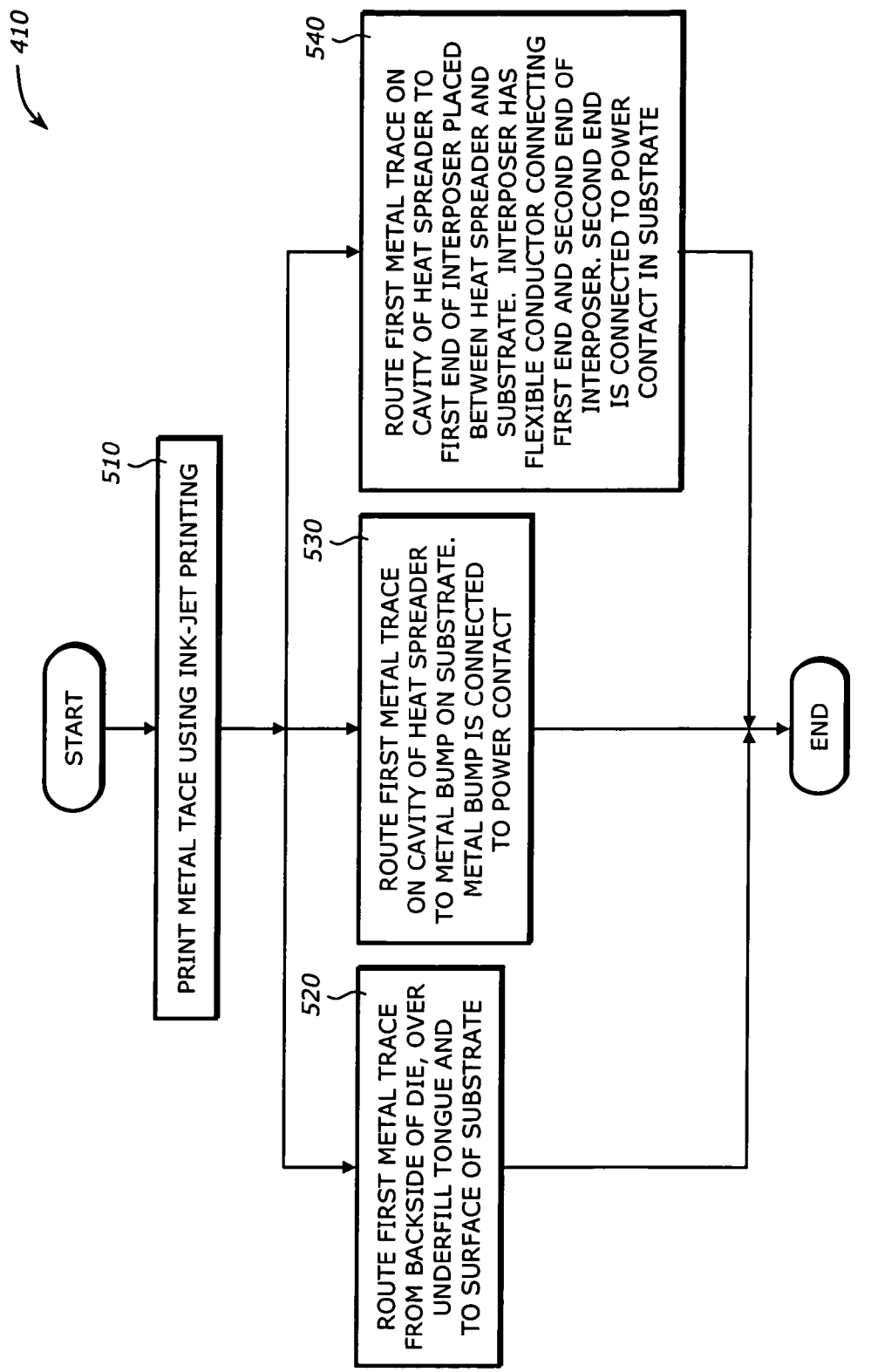
FIG. 5 is a flowchart illustrating a process to print a metal trace of the device assembly according to one embodiment of the invention.

FIG. 5 is a flowchart illustrating a process 410 to print a metal trace of the device assembly according to one embodiment of the invention Upon START, the process 410 prints the metal trace using a printing method such as an ink-jet printing (Block 510). Then, the process 410 may proceed with one of the three options. In the first option, the process 410 routes the first metal trace from backside of the die, over an underfill tongue and to surface of the substrate (Block 520) and is then terminated. In the second option, the process 410 routes the first metal trace on the cavity of the heat spreader to a metal bump on the substrate (Block 530) and is then terminated. The metal bump is connected to the power contact. In the third option, the process 410 routes the first metal trace on the cavity of the heat spreader to a first end of an interposer placed between the heat spreader and the substrate (Block 540) and is then terminated. The interposer has a flexible conductor connecting the first end and a second end of the interposer. The second end is connected to the power contact in the substrate.

Embodiments of the invention have been described with a device assembly. A printing technique is used to print the metal interconnect. The ink-jet printing method provides a flexible way to fabricate the metal interconnect or trace. All other suitable methods of printing are contemplated such as thread dispensing, spraying, stamping, screen printing, flexographic printing, plano-graphic printing, thermography, hot stamping and transfer printing, etc. In addition, any external device other than a TEC may be attached or mounted on the printed metal place such as a moisture sensor, pressure sensor, etc.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   printing a first metal trace on a die attached to a substrate having a power contact in the substrate or a cavity of a heat spreader to electrically connect the first metal trace to the power contact, the substrate or the heat spreader being in a package, the die being between the first metal trace and the substrate; and
   mounting a device on the first metal trace, the device being a thermo-electric cooler (TEC) and receiving power from the substrate via the power contact when the package is powered.

2. The method of claim 1 wherein printing comprises:
   routing the first metal trace from backside of the die, over an underfill tongue and to surface of the substrate.

3. The method of claim 1 wherein printing comprises:
   printing the first metal trace using ink-jet printing.

4. The method of claim 1 further comprising:
   curing the first metal trace before mounting the device.

5. The method of claim 1 wherein printing comprises:
   printing the first metal trace using a metal being one of copper, silver, aluminum, gold, solder, and metal alloy.

6. The method of claim 1 further comprising:
   printing a second metal trace, the second metal trace forming a multi-layered structure with the first metal trace.

7. The method of claim 1 wherein the TEC cools the die when the package is powered.

8. The method of claim 1 wherein the power contact is located at a plated through hole or a stacked via through a metal pad.

9. The method of claim 1 wherein the first metal trace has a resolution of less than 10 μm.

10. The method of claim 1 wherein the TEC is a solid state heat pump.

11. The method of claim 1 wherein the TEC includes an array of p-type and n-type semiconductor elements that act as two dissimilar conductors.

* * * * *